United States Patent [19]
Jorgensen et al.

[11] Patent Number: 5,153,780
[45] Date of Patent: Oct. 6, 1992

[54] METHOD AND APPARATUS FOR UNIFORMLY CONCENTRATING SOLAR FLUX FOR PHOTOVOLTAIC APPLICATIONS

[75] Inventors: Gary J. Jorgensen, Pine; Meir Carasso, Lakewood; Timothy J. Wendelin, Golden; Allan A. Lewandowski, Evergreen, all of Colo.

[73] Assignee: The United States of America as represented by the United States Department of Energy, Washington, D.C.

[21] Appl. No.: 712,812

[22] Filed: Jun. 10, 1991

[51] Int. Cl.$^5$ .............................................. G02B 5/08
[52] U.S. Cl. .................................. 359/853; 359/851; 359/869
[58] Field of Search ................ 359/851, 853, 868, 869

[56] References Cited

U.S. PATENT DOCUMENTS

| | | | |
|---|---|---|---|
| 2,751,816 | 6/1956 | Strong | 359/853 |
| 3,523,721 | 8/1970 | Hofmann | 359/851 |
| 4,919,527 | 4/1990 | Saiylov et al. | 359/853 |

Primary Examiner—Bruce Y. Arnold
Assistant Examiner—J. P. Ryan
Attorney, Agent, or Firm—Kenneth Richardson; James W. Weinberger; William R. Moser

[57] ABSTRACT

A dish reflector and method for concentrating moderate solar flux uniformly on a target plane on a solar cell array, the dish having a stepped reflective surface that is characterized by a plurality of ring-like segments arranged about a common axis, and each segment having a concave spherical configuration.

34 Claims, 2 Drawing Sheets

METHOD AND APPARATUS FOR UNIFORMLY CONCENTRATING SOLAR FLUX FOR PHOTOVOLTAIC APPLICATIONS

CONTRACTUAL ORIGIN OF THE INVENTION

United States Government has rights in this invention pursuant to Contract No. DE-AC02-83CH10093 between the United States Department of Energy and Solar Energy Research Institute, a division of the Midwest Research Institute.

BACKGROUND

1. Field of the Invention

The invention relates generally to a method and a reflector apparatus for concentrating solar energy, and more specifically relates to a solar concentration method and reflector for concentrating solar flux evenly on a solar cell array.

2. Description of the Prior Art

Paralleling the efforts aimed at reducing the cost of electrical energy generated by terrestrial photovoltaic (PV) systems by reducing the cost of solar cells and increasing their efficiencies, is the development of the concept of solar concentration for PV applications. As an alternative to the deployment of large-area solar cells in flat, non-concentrated arrays, concentrating devices and systems promise to greatly decrease the amount of cell area required in converting sunlight intercepted in a given area. Considerably less solar cell area is required in a system that uses concentrated sunlight because the efficiency of such cells increases logarithmically with the level of solar irradiance, up to the point where the heating of the cells prevents further gains despite cooling efforts. Thus, a significant cost advantage may be obtainable since solar cells typically are of two orders of magnitude more expensive per unit area than the materials used for the solar concentrating component of a photovoltaic conversion system. It therefore becomes feasible to employ relatively expensive high-efficiency solar cells in a PV solar conversion system that promises to produce electricity at a cost much lower than electricity provided by a comparable flat array configuration.

In a concentrating photovoltaic system, the sunlight is concentrated to relatively moderate levels, for example from ten to several hundred "suns." It is of great importance that this level of illumination be uniformly distributed across the face of the solar cells for optimum conversion efficiency. In a typical solar conversion system the solar cells in the plane of illumination are connected in series to obtain sufficient output voltage, and cells connected in series are limited in current to that of the cell with the lowest current. This places a premium on illuminating each cell equally. It is further noted that for each individual cell, non-uniform illumination of that cell will cause a loss of cell efficiency. Thus, it is desirable to provide a uniform flux density over each of the individual solar cells of an array and also over the entire array for optimum conversion efficiency. Regarding flux intensity, it is expected that modern PV conversion systems that concentrate flux on high-efficiency cells will attain optimum performance at concentration levels in the moderate range of 50 to 200 suns. Investigators using relatively expensive high-efficiency silicon solar cells have found peak performance efficiencies to be achieved with concentrations in the range of 75 to 100 suns. This is disclosed in Rios, M. Jr., and Boes, E. C., 1982, "Photovoltaic Concentrator Technology", *Progress in Solar Energy, The Renewable Challenge* Vol. 5, Part 3 of 3, Review and Indices, 1982 Annual Meeting, American Solar Energy Society, Houston, Tex., Franta, G. E., et al., eds., pp. 1563–1576.

The prior art contains various approaches to solar concentration for photovoltaic applications; however, existing systems generally do not satisfy the uniform flux concentration requirements, and the need for improved solar concentrators remains. One approach to the problem has been to use a Fresnel refractor lens such as a flat lens or a roof lens for refracting solar energy onto a flat PV plane. Curved Fresnel lenses are also employed in concentrator systems with some degree of performance success. However, these conventional compression-molded acrylic Fresnel lenses are relatively costly, require costly module housings, and are susceptible to thermal and mechanical failure. Other drawbacks of the Fresnel lens concentrator concept include transmission losses through the lens. A secondary concentrator has been proposed as a way of achieving higher concentrations (200 to 500 suns) and increasing the uniformity of the flux profile. This is discussed in the publication of Winston, R., and O'Gallagher, J., 1988, "Performance of a Two-Stage 500X Nonimaging Concentrator Designed for New High Efficiency, High Concentration Photovoltaic Cells," *Solar '88* Coleman, M. J., ed., *Proceedings of the 1988 Annual Meeting,* American Solar Energy Society, Inc., Cambridge, Mass., pp. 393–395. It is noted however, that for applications which do not require such high levels of concentration, the addition of a secondary concentrator adds cost and complexity.

Another major approach has been to concentrate sunlight by way of reflection, and the prior art provides several examples of the use of reflector systems for concentrating solar flux. Parabolic dish reflectors that are disclosed relate primarily to the solar thermal dish technology where highly localized and concentrated flux, of the order of thousands of suns, is required. Concentrators employing reflective elements that are concave spherical in shape have also been devised. See Authier, B. and Hill, L., 1980, "High Concentration Solar Collector of the Stepped Spherical Type: Optical Design Characteristics," *Applied Optics,* Vol 19, No. 20, pp. 3554–3561. These are also thermal, point-focusing designs that are not adapted for harnessing concentrated flux at the relatively moderate concentrations (75 to 200 suns) found desirable for PV cell applications and do not provide a means of achieving such flux with uniformity over a target plane.

One reflector concentrator system that is specifically designed for PV applications is disclosed in the article, Kurzweg, U. H., 1980, "Characteristics of Axicon Concentrators for Use in Photovoltaic Energy Conversion", *Solar Energy,* Vol. 24, pp. 411–412. In this article the solution to the uniform flux concentration requirement is to use axisymmetric reflector-absorber combinations for yielding uniform flux density at the absorber surface. These axisymmetric concentrators involve non-flat target geometries such as the surface of an inner cone that is coated with solar cells. This contributes little to the advancement of a concentrator system that can obtain optimal performance by virtue of projecting uniform flux on a flat planar target containing an array of solar cells.

Yet another photovoltaic dish solar-electric concept is presented in Swanson, R. M., July 1988, "Photovoltaic Dish Solar-Electric Generator", *Proceedings of the Joint Crystalline Cell Research*, and Concentrating Collector Projects Review SAND88-0522, Sandia National Laboratories, Albuquerque, NM, pp. 109–119. A reflective parabolic dish is employed to focus sunlight at the entrance of a receiver cavity and to convert the non-uniform entering flux into a uniform flux at the plane of a solar cell array mounted in the receiver. Light entering the cavity diverges as it proceeds beyond the primary focus and eventually is reflected off the sides of the cavity for dispersal over the cell array plane. Unfortunately, the cost and complexity of such designs are increased by the requirement of a receiver.

In an example of prior art that is not specific to PV applications, U.S. Pat. No. 4,195,913 shows an optical integrator for electromagnetic radiation that has a plurality of reflective segments attached to a spherical concave surface. This attempt to produce a light beam of uniform intensity requires the individual attachment of many reflective surface elements and is rather complex. Thus it does not lend itself to low-cost fabrication methods and techniques required by the solar conversion industry in its drive to develop relatively inexpensive yet highly effective concentrators for PV conversion systems.

A novel and unique solar concentrator approach is provided by the present invention, which presents a solution particularly well adapted for optimal photovoltaic conversion, by projecting in a manner heretofore unavailable, moderately concentrated solar flux with uniform intensity across a solar cell target plane. The attributes of the present invention are reflected in the following objects.

SUMMARY OF THE INVENTION

In view of the limitations and drawbacks of the foregoing prior art, it is a general object of the present invention to provide a method for concentrating a uniform flux of moderate solar energy over the target plane of a solar cell array, and a solar reflector dish that accomplishes the same.

Another object of the present invention is to provide a solar reflector that lends itself to economical production techniques, such as production employing a single-piece mold or stamping technique.

An associated object is to provide a solar reflector concentrator that is efficient, effective, and reasonably inexpensive.

Still another object is to provide a reflector designed for photovoltaic applications that does not involve labor intensive and complex adjustment and alignment procedures in order to be effectively deployed.

Yet another object is to provide a solar reflector that attains uniform intensity distribution over a target plane in a manner that accounts for real world optical errors and sun shade effects in its design.

A further object is to provide a solar reflector dish for concentrating the uniform flux on a target without the requirement of a receiver element or a secondary concentrator.

A still further object is to provide a reflector dish that uses a plurality of reflective elements having surfaces that can be tailored to provide a desired moderate flux level and uniform profile.

The preceding and still other objects and advantages are achievable by the present invention, which comprises novel method and means for projecting on a target plane uniformly concentrated solar flux at moderate levels for PV applications. The reflector of the invention includes a plurality of concave conic sectional surfaces of rotation arranged about a common axis and comprising reflective surface elements, and each surface element is defined in a predetermined manner by its spacing in an axial direction to the front of a parabolic reference dish that has a vertex spaced apart from the target plane by a distance equal to its focal length, to produce moderate uniform flux concentrations in the range of about 75 to 300 suns. In a preferred embodiment, three to five spherical concentric reflective surface elements are employed, each of equal effective reflective surface area and each element having a curvature equal to one-half the focal length of the reference dish. The specularity of the reflective elements is deliberately degraded in a predetermined manner to achieve desired moderate flux intensity and evenness of distribution over the target plane.

BRIEF DESCRIPTION OF THE DRAWINGS

The accompanying drawings, which are incorporated in and form a part of the specification, illustrate preferred embodiments of the present invention and together with the description serve to explain the principles of the invention, wherein.

DETAILED DESCRIPTION OF THE INVENTION

Figure 1:
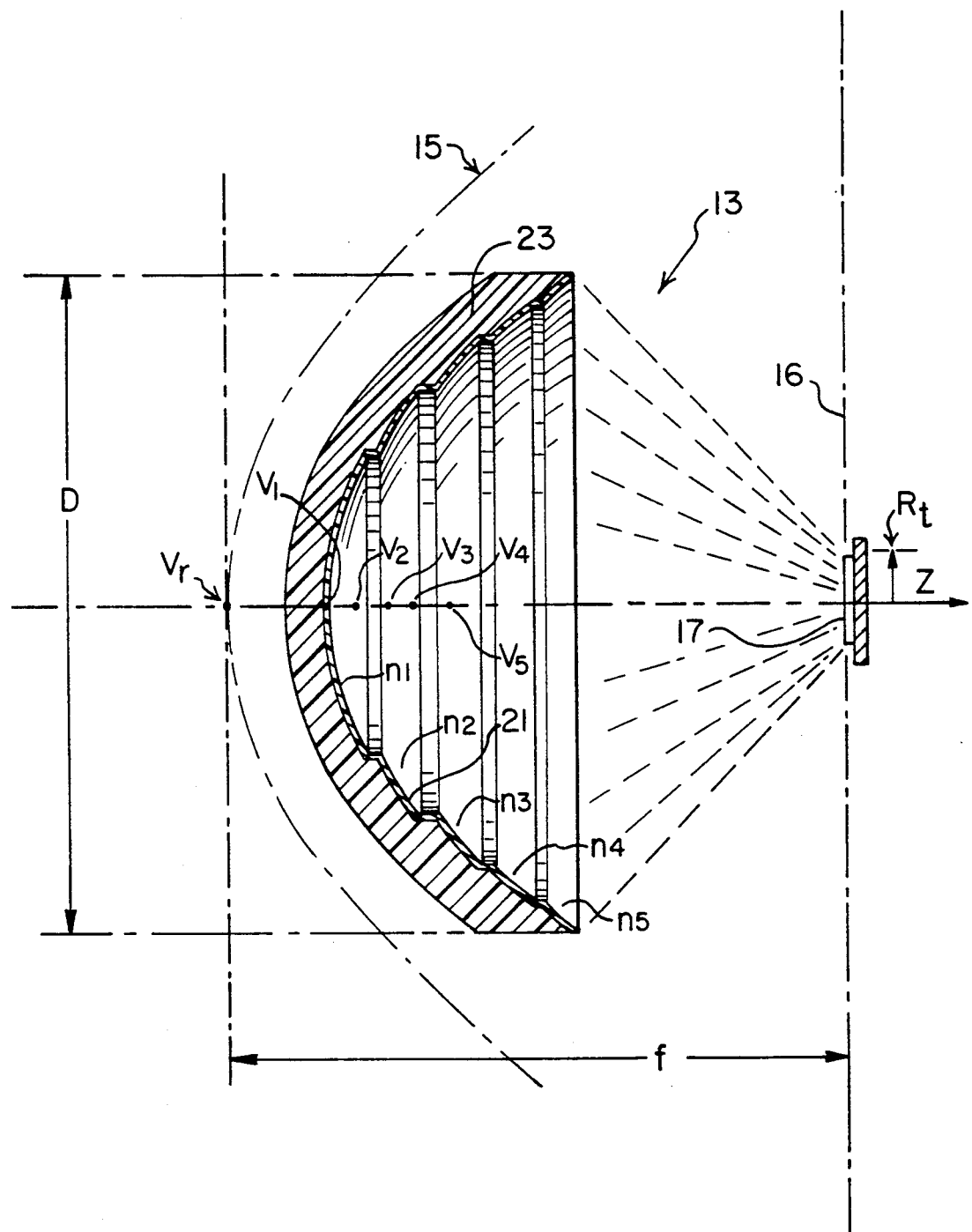
FIG. 1 is a diagrammatic side cross-sectional illustration of apparatus in accordance with the present invention.

Referring now to the drawings, FIG. 1 illustrates a preferred embodiment of a plural-stepped concentrator dish 13 according to the present invention. The reflective surface is comprised of five reflective surface elements, including a hub element designated by reference figure n1 and ring-shaped reflective elements n2–n5, and all the elements lie symmetrically about a common axis Z.

It is noted that each of the reflective elements (n1–n5) is a surface of rotation provided by a concave, spherical segment. The total aperture area of reflector 13 is the circular area across the outer rim of reflector 13. The size of each of the reflective elements n1–n5 may be defined by reference to the intercepted area that each element projects in the Z direction upon the plane of the aperture. For example, projections from the periphery of the central reflective element n1 will intercept the plane of the aperture to form a circle, and the size of element n4 is represented by the area of that circle. Similarly, each of the special segments n2–n5 will project an annulus upon the aperture plane, and has a size reflected in the area of each respective annulus. In the preferred embodiment herein described, the intercepted area of each reflective element is chosen to represent one-fifth of the total aperture area.

The reflective elements n1–n5 are definable by reference to a reference dish 15, an imaginary parabolic dish that shares the common axis Z, as shown. Reference dish 15 has a vertex Vr and a focal length f. A target plane 16, perpendicular to the Z axis, lies at a distance equal to the focal length f from vertex Vr, and the absorbing surface of an array 17 of solar cells is supported in the plane 16 as illustrated. The rectangular array 17 is disposed within the confines of a circle in the target plane 16 having a radius Rt. The position of each reflective segment may then be defined by its displacement along the Z axis from the reference dish 15. The displacement of each reflective element from reference dish 15 is appreciated by reference to the vertices of the respective reflective elements. Vertex V1 is the intersection of the hub element n1 with the common axis Z. Vertex V2 is the intersection with axis Z of an extension of the imaginary sphere in which reflective element n2 lies. Similarly, V3, V4, and V5 are each vertices respectively of the ring-like reflective segments n3, n4 and n5.

Also note that each spherical segment (n1-n5) preferably has a curvature equal to $1/(2f)$. In the preferred embodiment herein disclosed, spherical sectional reflective segments are chosen because it was discovered that aberrations associated with such concave spherical reflective sections tend to spread out the image at the focal plane, resulting in a larger usable target area. Using spherical segments also serves to provide power flux levels lower than those associated with parabolic concentrators, which as pointed out hereinabove are too high and too peaked for the relatively moderate solar concentrations (75 to 300 suns) considered desirable for efficient and effective use with available high-efficiency solar cells.

In one example of a five-step dish concentrator according to the present invention, the pertinent parameters are shown below, in Table 1.

TABLE 1

| Reflective Segment | Z Displacement Meters (M) | Outer Radius (M) | Curvature (M) |
| --- | --- | --- | --- |
| n1 | 0.070 | 0.335 | 0.666 |
| n2 | 0.090 | 0.474 | 0.666 |
| n3 | 0.100 | 0.581 | 0.666 |
| n4 | 0.110 | 0.671 | 0.666 |
| n5 | 0.120 | 0.750 | 0.666 |

An overall aperture diameter D of 1.5 m was used in a system where $f/D=0.5$.

Figure 2:
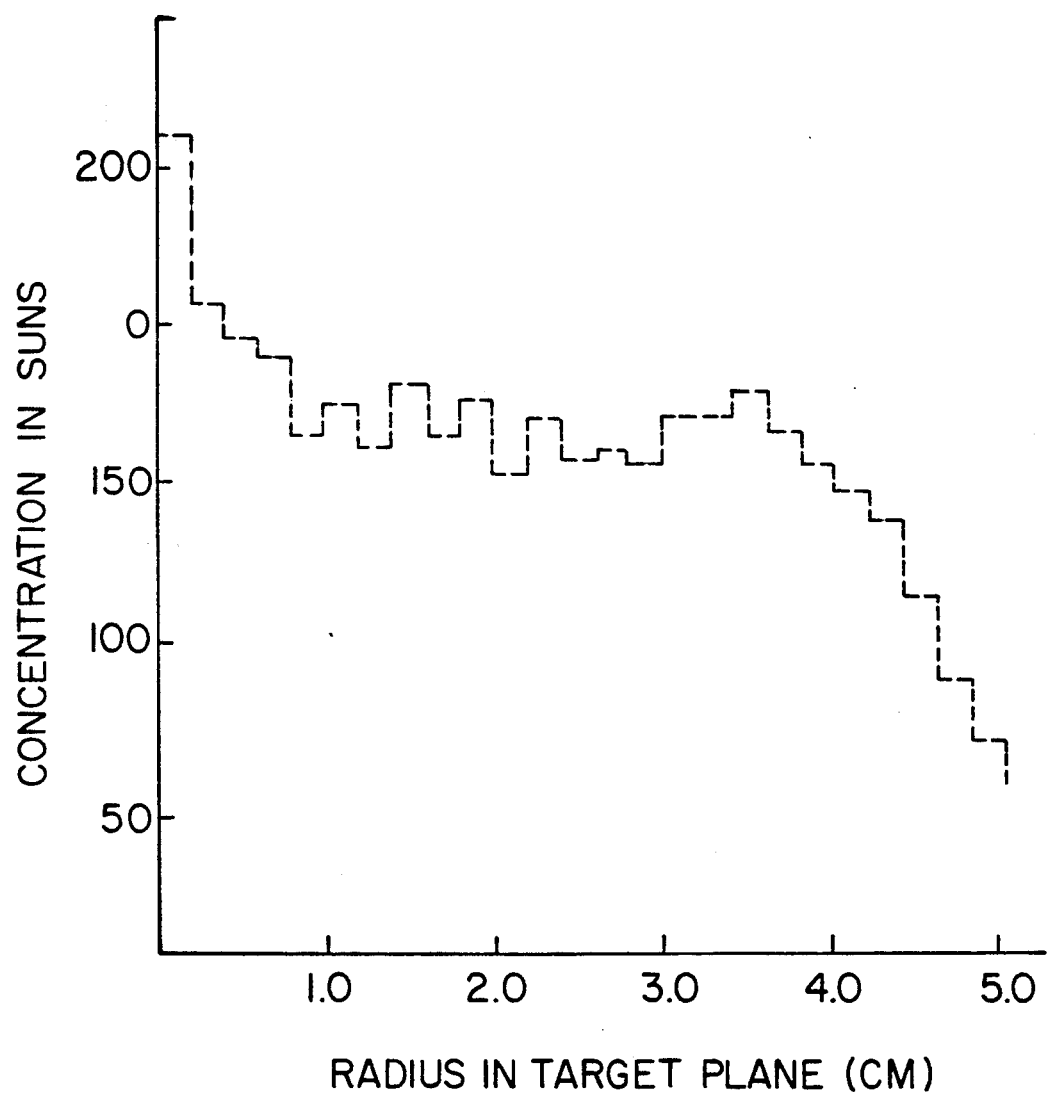
FIG. 2 is a graphic illustration of solar flux concentration provided by a preferred embodiment of the present invention across a target plane.

In a computer model regarding this embodiment of the invention, 10,000 randomly generated rays were traced off the subject five-step reflector to the target plane 16. The resulting flux profile of solar concentration in suns as a function of radial position in a circular target is shown in FIG. 2.

The radial position of each ray as it intersects the target plane was tallied into concentric annular bins (35 bins). The concentration ratio (in suns) is then the number of rays per annular bin divided by the total number of rays per dish aperture area, multiplied by the assumed reflectance of the dish (0.90). The resulting frequency histogram of FIG. 2 shows that a fairly flat concentration of about 175 suns, out to 4.5 cm, is obtainable according to the present invention. In this example a specularity error of about 5.0 mrad is chosen. Appreciably higher values of specularity error result in non-uniformity. Also, the data shown in FIG. 2 are for a slope error of 3.0 mrad and a Gaussian sun shape with sigma=2.73 mrad.

A great advantage of dish reflectors having reflective surfaces according to the present invention is that they can be economical and easy to manufacture. Dish substrates can be molded of a suitable polymeric material using techniques available in the plastics molding industry. Suitable thermoplastic materials include styrenic resins such as polystyrene and ABS plastic. Dish substrates can also be molded of a thermosetting polymer such as polyurethane. Fabrication is completed by bonding to the stepped surface of the substrate a thin layer of a reflective film. Reflective films that are particularly suitable for solar applications are commercially available from the Minnesota Mining and Manufacturing Corporation of St. Paul, Minn.

In FIG. 1 the reference numeral 21 identifies a thin polymeric reflective film that covers the stepped surface of a molded polyurethane dish substrate 23.

Dishes according to the invention can also be economically and easily manufactured in the form of a sheet metal stamping. Assembly is completed by covering the stepped surfaces of the stamped metal pieces with a suitable reflective film.

Whereas the reflective surfaces of conventional solar concentrators are designed to be highly specular and smooth, a unique aspect of the present invention is seen in the deliberate degradation of its reflective surfaces by predetermined amounts. According to the present invention, optical errors such as specularity errors, are not minimized but are fashioned into the reflective surfaces, and contribute to improved uniformity of flux distribution in the target plane. Herein lies an additional advantage of the invention—the higher surface errors allow easier fabrication constraints and tolerances, which lower manufacturing costs. In the fashioning of its reflective surfaces the invention also takes into consideration the slope error, which surface error conventional reflector technology ordinarily seeks to minimize. Certain appreciable levels of slope error, fashioned in the reflective surfaces of the invention also contribute to flux uniformity.

Sandblasting is contemplated as one technique for imparting desired levels of deliberate surface error in the reflective surfaces of dish reflectors constructed according to the present invention. More particularly, in the case where the dish is made of a sheet metal stamping, as discussed above, the entire substrate surface of the stamped metal blank dish is treated to sandblasting. To complete the fabrication, a suitably thin and pliable polymeric reflective film, such as of a type that is specified above, is bonded to the degraded dish substrate, which substrate surface will "print through" and take on the surface features of the metallic substrate. In the case where dishes according to the invention begin as molded blanks of a suitable polymeric material, as discussed above, the relevant surface of the metallic production mold will receive a sandblasting treatment to evenly abrade it to a predetermined extent. The resulting molded dish blanks will be impressed with correspondingly degraded surfaces. As in the case of the sheet metal substrate, a suitable reflective thin polymeric film is then bonded over the degraded surfaces of the substrate, so as to take on the characteristics of the degraded substrate surfaces.

In order to monitor the surface-abrading processes mentioned above, and to achieve the desired levels of degradation of reflectance values, persons with ordinary skill in the art have available various techniques for measuring directly the pertinent reflectance characteristics of a surface. One measuring device suitable for this purpose is the portable reflectometer that is available as Model 15-R, from the Devices and Services Company of Dallas, Tex. Also, see Freese, J., 1978, "The Development of a Portable Specular Reflectometer," Sandia Laboratories Report SAND 78-1918.

Also note that spherical shapes are chosen for the configuration of the reflective elements of preferred embodiments of the invention. Besides contributing to the spreading of flux uniformly over the target plane at moderate concentration levels, the spherical shape further simplifies and economizes the required stamping or molding process, since such shapes are easier to achieve.

The present invention can be used to provide uniform flux levels of 75 to 400 suns, and reflectors constructed according to the invention can be fashioned to achieve a desired flux level with ±10% uniformity.

The number and relative size of each reflective element can be varied. The type of conic section and magnitude of the vertex curvature can also be changed. Each section can likewise be shifted a varying amount along the common axis, and optical errors of the surface can be tailored.

Using available computer modeling techniques, those with ordinary skill in the art can be assisted in fashioning configurations of reflective elements according to the present invention. CAD software packages for solar concentrator optical configurations are commercially available in the art from James Associates of Boulder, Colo. Another commercial source is the CIRCE computer program, available from Sandia National Laboratories of Albuquerque, N.Mex.

While there has been described a particular embodiment of the invention, it will be obvious to those skilled in the art that various changes and modifications may be made therein without departing from the invention, and therefore it is aimed to cover all such changes and modifications as fall within the true scope and spirit of the invention.

The embodiments in which an exclusive property or privilege is claimed are defined as follows:

1. A dish reflector for concentrating solar flux uniformly over a target plane on a solar cell array, said reflector comprising a plurality of concentric, concave, reflective surface elements, arranged symmetrically about a common axis which is perpendicular to said target plane, and each of said surface elements being defined with respect to its axial position forward of a parabolic reference dish sharing said common axis and having a vertex spaced from said target plane by a distance equal to the focal length of said reference dish.

2. A dish reflector as defined in claim 1 wherein each of said reflective surface elements comprises an equal fraction of the total reflective surface of said reflector.

3. A dish reflector as defined in claim 1 wherein said reflective surface elements are equal in surface area.

4. A dish reflector as defined in claim 3 wherein each of said reflective surface elements comprises a spherical segment.

5. A dish reflector as defined in claim 1 wherein each of said reflective surface elements is displaced from said reference dish by a predetermined amount.

6. A dish reflector as defined in claim 5 wherein each of said reflective surface elements has a curvature equal to 1/(2f) were f is the focal length of said reference dish.

7. A dish reflector as defined in claim 5 wherein each of said elements comprises a spherical configuration.

8. A dish reflector as defined in claim 5 wherein each of said reflective elements comprises a spherical segment and wherein the ratio of the focal length of said reference dish to the diameter of the aperture of said dish is equal to about 0.5.

9. A dish reflector as defined in claim 1 wherein each of said reflective surface elements comprises a spherical segment.

10. A dish reflector as defined in claim 9 wherein the solar concentration along said target plane is in the range of ±10% of 175 suns.

11. A dish reflector as defined in claim 1 wherein the curvature of each of said reflective surface elements is adapted to produce aberrations that spread out the solar image formed by said solar reflector on said target plane.

12. A dish reflector as defined in claim 11 wherein each of said elements comprises a spherical segment.

13. A dish reflector as defined in claim 11 comprising five said reflective elements.

14. A dish reflector as defined in claim 1 comprising three to five of said reflective elements.

15. A dish reflector as defined in claim 14 wherein each of said spherical reflective elements has a curvature equal to one-half the focal length of said reference dish.

16. A dish reflector as defined in claim 15 comprising five of said elements.

17. A dish reflector as defined in claim 1 comprising five said reflective elements.

18. A dish reflector as defined in claim 17 wherein said target plane is a circle of about 3.0 to 4.0 cm in diameter.

19. A dish reflector as defined in claim 1 wherein each of said reflective elements has a degraded surface with specularity errors that tend to spread the flux reflected from each said element.

20. A dish reflector as defined in claim 19 wherein said uniform flux is range of about 175 suns.

21. A dish reflector as defined in claim 19 wherein the specularity of said reflector is about 3.0 mrad.

22. A dish reflector as defined in claim 1 wherein each of said reflective elements has a spherical configuration adapted to provide optical aberrations that spread out over said target plane.

23. A dish reflector as defined in claim 1 wherein the specularity of each of said reflective elements is in the range of about 1.5 to 3.0 mrad.

24. A dish reflector as defined in claim 1 wherein ech of said reflective elements has a parabolic configuration.

25. A dish reflector as defined in claim 1 wherein the vertices of each of said elements are displaced from the vertex of said reference dish be a predetermined distance from said reference dish along said common axis.

26. A method for concentrating solar flux to moderate levels of concentration, in the range of 75 to 400 suns, uniformly over a target plane on a solar cell array, including the steps of:
 a) providing a dish reflector comprising a plurality of concentric, concave, reflective surface elements, arranged symmetrically about a common axis, and each of said surface elements being defined with respect to its axial position forward of a parabolic reference dish sharing said common axis;
 b) positioning said reflector relative to said target plane such that said common axis is perpendicular to said target plane and such that the vertex of said parabolic reference dish is spaced from said target plane by a distance equal to the focal length of said reference dish; and
 c) receiving said solar flux and reflecting it from said reflector onto said target plane.

27. A method as defined in claim 26 for concentrating solar flux in the range of 75 to 200 suns.

28. A method as defined in claim 27 wherein each of said reflective surface elements is essentially equal in effective surface area.

29. A method as defined in claim 26 wherein said reflective elements comprise spherical segments.

30. A method as defined in claim 26 wherein each of said reflective elements has a curvature equal to $1/(2f)$, where f is the focal length of said reference dish.

31. A method as defined in claim 26 including the step of degrading said reflective surface elements to increase the specularity error of said reflective surface elements in a predetermined manner.

32. A method as defined in claim 31 wherein said reflective elements are degraded so as to have specularity error in the range of 5.0 to 10.0 mrad.

33. A method as defined in claim 31 wherein the number of said reflective elements present is in the range of three to five.

34. A method as defined in claim 31 including the step of intimately covering said surface elements with a thin layer of reflective material whereby said thin layer takes on the surface characteristics of said elements.

* * * * *